United States Patent
Dong et al.

(10) Patent No.: US 8,432,229 B2
(45) Date of Patent: Apr. 30, 2013

(54) PVT CONSISTENT PLL INCORPORATING MULTIPLE LCVCOS

(75) Inventors: Yikui Jen Dong, Cupertino, CA (US); Freeman Y. Zhong, San Ramon, CA (US)

(73) Assignee: LSI Corporation, Milpitas, CA (US)

( * ) Notice: Subject to any disclaimer, the term of this patent is extended or adjusted under 35 U.S.C. 154(b) by 64 days.

(21) Appl. No.: 13/179,653

(22) Filed: Jul. 11, 2011

(65) Prior Publication Data

US 2012/0262238 A1    Oct. 18, 2012

Related U.S. Application Data

(60) Provisional application No. 61/475,262, filed on Apr. 14, 2011.

(51) Int. Cl.
*H03B 2201/025* (2011.01)
*H03B 2201/02* (2011.01)

(52) U.S. Cl.
USPC ............. 331/2; 331/176; 331/177 V; 331/167

(58) Field of Classification Search ................... 331/176, 331/177 V, 2, 167, 46
See application file for complete search history.

(56) References Cited

U.S. PATENT DOCUMENTS

| 6,621,362 | B2 | 9/2003 | Momtaz et al. | |
|---|---|---|---|---|
| 6,670,833 | B2 | 12/2003 | Kurd et al. | |
| 6,952,141 | B1 | 10/2005 | Fransis | |
| 7,154,342 | B2 | 12/2006 | Munker et al. | |
| 7,940,140 | B2 * | 5/2011 | Zeng et al. | 331/179 |
| 2008/0278249 | A1 | 11/2008 | Hyvonen | |

* cited by examiner

*Primary Examiner* — Arnold Kinkead

(57) ABSTRACT

In described embodiments, a wide toning-range (WTR) inductive-capacitive (LC) phase locked loop (PLL) provides for a large range of differing oscillation frequencies with a set of individual LC voltage controlled oscillator (VCO) paths. The output of each individual wide range LCVCO path is provided to a multiplexor (MUX), whose output is selected based on a control signal from, for example, a device controller. Each of the set of individual wide range LCVCO paths includes a switch that couples the LCVCO to a loop filter of a voltage tuning module, wherein each switch also receives the control signal to disable or enable the LCVCO path when providing the output signal from the MUX. Each switch is configured so as to minimize leakage current drawn by the LCVCO when disabled, and to reduce or eliminate effects of input capacitance of each dormant LCVCO to the loop dynamics of the PLL.

20 Claims, 16 Drawing Sheets

FIG. 4A
303
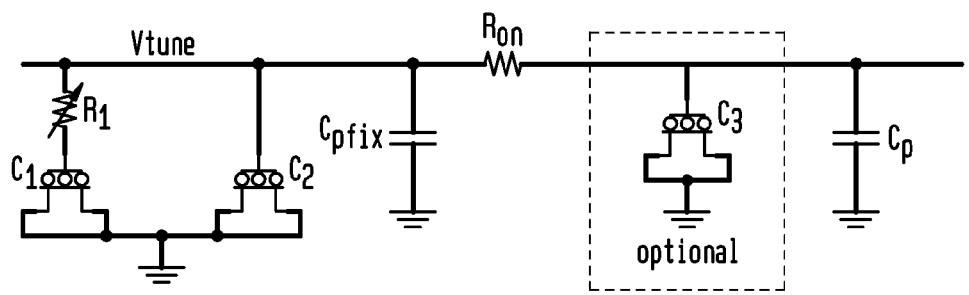
FIG. 4B
| | TRANSISTOR TYPE NOTATION | |
|---|---|---|
| THICK OXIDE TRANSISTORS | | |
| THIN OXIDE TRANSISTORS | | |
FIG. 5
305(1)
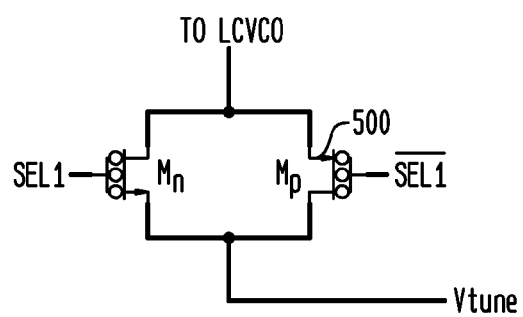

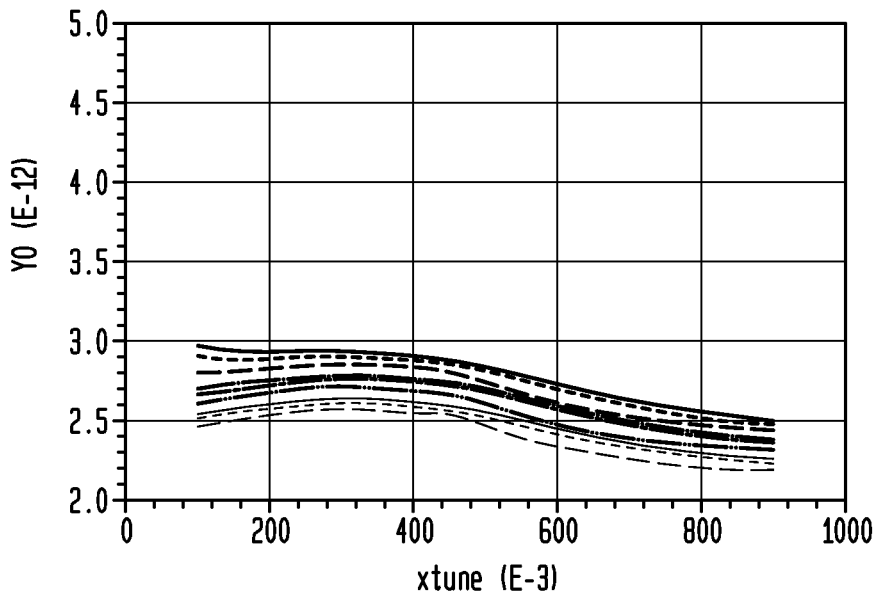
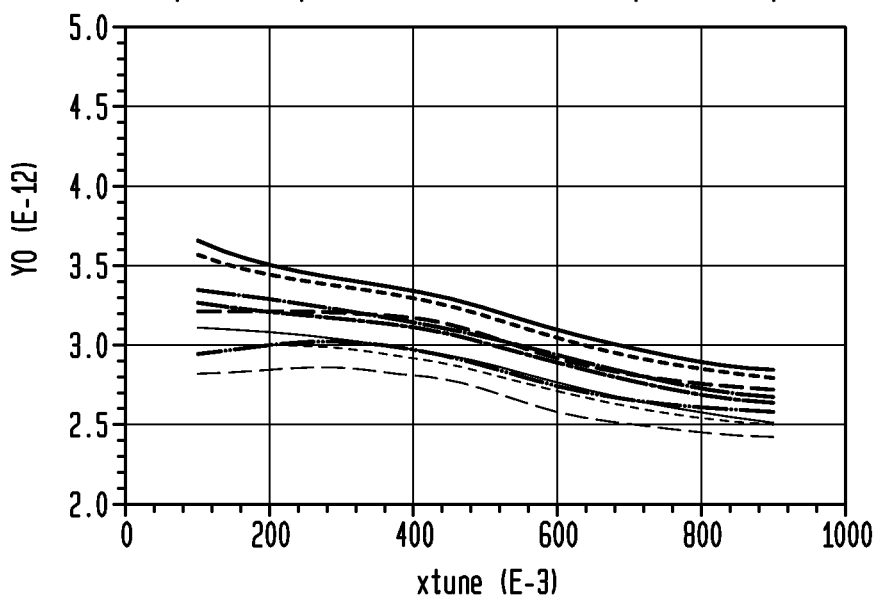

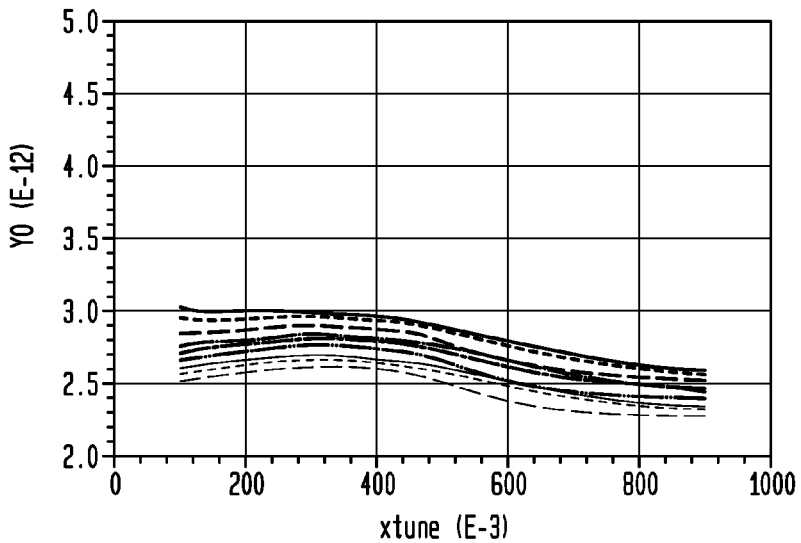
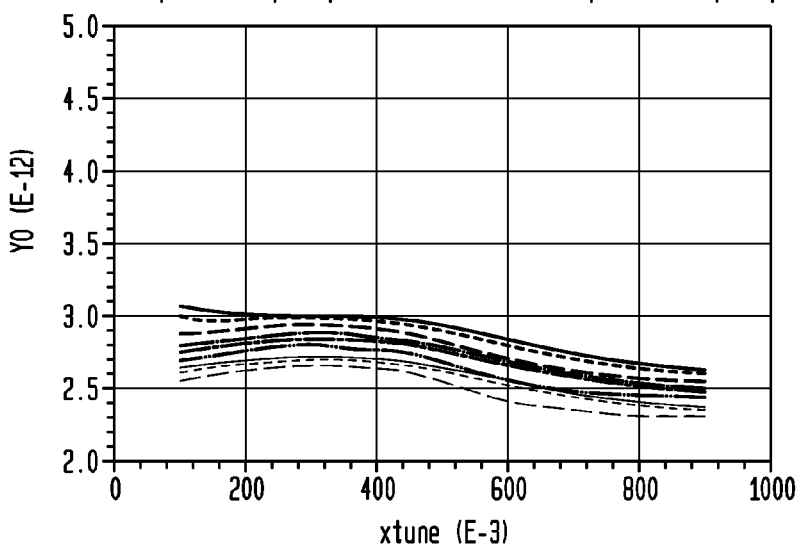

PVT CONSISTENT PLL INCORPORATING MULTIPLE LCVCOS

CROSS-REFERENCE TO RELATED APPLICATIONS

This application claims the benefit of the filing date of U.S. provisional application No. 61/475,262, filed on Apr. 14, 2011, the teachings of which are incorporated herein by reference.

BACKGROUND OF THE INVENTION

1. Field of the Invention

The present invention relates to circuits, and, in particular, to a phase-locked loop incorporating multiple oscillators.

2. Description of the Related Art

A phase locked loop (PLL) is widely used in communications systems for clock synthesis and generation. The PLL is a closed-loop frequency-control system based on the phase difference between the input clock signal and the feedback output signal of a controlled oscillator. The main blocks of the PLL are the phase frequency detector (PFD), a charge pump, a loop filter, a voltage controlled oscillator (VCO), and counters. The VCO frequency range of oscillation directly determines the top and bottom oscillation rates of the PLL. A common application of a PLL is in a serializer-deserializer (SERDES) device. The range of standard specified clock rates a SERDES device can support, and its quality, is fundamental to the performance of the overall system employing the SERDES device. The top oscillation frequency, Rj and Pj levels (random and periodic jitter levels, respectively), tuning range (range of oscillation frequencies), and start-up margin are key performance measures for an PLL. These key performance measures are related and coupled to one another, making a design have direct performance measure trade-offs with each other in a conventional PLL design.

A high-performance PLL with a wide tuning range is difficult to implement for 10 GHz+ applications. The difficulty with implementing a wide-tuning range PLL is especially true for deep submicron standard CMOS technology with high gate and channel leakage, such as 40 nm geometry CMOS technology integrated circuit (IC) chips. The degradation in performance increases if the PLL operates in large system-on-chip (SoC environment, which is typical for SERDES applications. Furthermore, for production designs in the field, satisfactory performance over varying process, voltage, and temperature (PVT) operation is required.

A single wide range LCVCO-based PLL, such as shown in FIG. 1A, offers better noise immunity to mid to high frequency supply noises than the multi-phase ring PLL architecture, and is particularly suitable for SoC applications. A lower frequency reference clock (Refclk) and a scaled version of the PLL output is applied to PFD 101, which generates an error signal proportional to the difference between its input signals. Based on this error signal, charge pump 102 increases or decreases charge applied to loop filter 103. Charge from charge pump 102 appears as a voltage Vtune provided by loop filter 103 that controls the oscillation frequency of LCVCO 104. LCVCO 104 is a wide range, full rate LCVCO which provides a signal to the channel at a desired oscillation frequency. In addition, this output signal from LCVCO 104 is provided to counter 105, which scales down the output frequency by NI, which scaled signal is then provided to PFD 101.

For the single wide range LCVCO-based PLL of FIG. 1A, a complimentary cross-coupled VCO architecture might be employed for LCVCO 104, such as shown in FIG. 1B. LCVCO comprises a cross-coupled differential amplifier 151 with an LC tank in its feedback path. This LC tank is composed of inductance provided by inductor 202 (with exemplary inductive value L1) and a capacitance provided by parallel-coupled varactors 154 (with exemplary capacitive values Var1) and switched capacitor banks 153 (with exemplary capacitive values C1). Switched capacitor banks 153 are optionally included to extend the tuning range of the VCO. The VCO oscillates as given in equation (1):

$$\omega_{osc} = \{L \cdot (C_{tran} + C_{load} + C_{rtg} + C_{sweap} + C_{var})\}^{\frac{-1}{2}} \quad (1)$$

where L is the inductance, $C_{tran}$ and $C_{load}$ are the loadings from the negative $g_m$ transistors of the differential amplifier and the following stage circuitry, $C_{rtg}$ is the circuit's routing and parasitic capacitance for the implementation, $C_{sweap}$ is the switched-capacitor bank capacitance, and $C_{var}$ is the varactor capacitance. The VCO gain is given by equation (2):

$$k_{vco} = -\frac{L}{2}\omega_{osc}^2 \frac{\partial C_{var}}{\partial V_{tune}} \quad (2)$$

As shown, coupling and trade-offs exist between the top oscillation frequency, the tuning range, the start-up margin, and the jitter performance. Switched-capacitor banks might be employed to extend the tuning range of the VCO, but the switched capacitor banks' Q factor limits the jitter performance of the overall circuit. Increasing the Q value increases the VCO's off-capacitance and reduces the top oscillation frequency. Further rate reduction comes from the $C_{rtg}$ growth for the extra routing needed for, and parasitic coupling from, the large switched capacitor banks; and from the $C_{tran}$ growth for sufficient start-up margin to cover the loading from the switched capacitor banks. Extending the tuning range by raising the varactor size, on the other hand, increases $k_{vco}$ and the jitter sensitivity. Therefore, obtaining both top oscillation at a relatively high frequency and bottom oscillation at a relatively low frequency, and while having sufficient start-up margin and good jitter performance, from a single LCPLL is difficult to achieve.

Consequently, designers have attempted to increase the tuning range of a PLL by simply adding separate LCVCO circuits, sometimes termed direct expansion. In such designs, unused ones of the separate LCVCO circuits are turned off or otherwise disabled. However, each unused LCVCO circuit might present a capacitive and resistive loading to the loop filter of the PLL. When a single LCVCO PLL is extended to have two LCVCO PLLs (a dual LCVCO PLL) and four LCVCO PLLs (a quad LCVCO PLL), the added impedance of the dormant circuit elements can have unwanted effects on operation. These variations in PVT performance from the dormant LCVCO impedance, especially at high oscillation frequency and small integrated circuit (IC) geometry, can cause the PLL to have unacceptable jitter performance and even exhibit unstable operation.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, the present invention allows for generating a signal with a phase locked loop (PLL) having a selected one of a plurality of oscillation frequencies. A multiplexor (MUX) selects the signal having the selected one of the plurality of oscillation frequencies based on a control signal. A loop filter provides a tuning voltage based on a feedback loop of the PLL. At least two inductive-capacitive (LC) voltage controlled oscillator (VCO) paths, each LCVCO path coupled between the loop filter and the MUX and having its oscillation frequency set by the tuning voltage, provide for different oscillation frequencies. Each LCVCO path comprises a LCVCO configured to provide an output signal at one of the plurality of oscillation frequencies, and a switch configured to i) couple the associated LCVCO to the tuning voltage when enabled by the control signal to set the LCVCO path to an active state, and ii) insert a relatively high impedance between the capacitance of the loop filter and the capacitance of the associated LCVCO when disabled by the control signal to set the LCVCO path into a dormant state, thereby setting the leakage current of the associated LCVCO to a relative minimal value and maintaining the capacitance value of the loop filter. The MUX provides an output of the LCVCO path in the active state to provide the signal having the selected one of the plurality of oscillation frequencies.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 4A shows an exemplary embodiment of a effective loop filter for voltage tuning of the WTR LCPLL of FIG. 3 having intentional loop-filter elements, parasitic capacitance; on-resistance of the switch and input capacitance of the active LCVCO;

FIG. 4B shows an exemplary thick and thin film transistor type notation as employed in the FIGs.;

FIG. 5 shows an exemplary embodiment of a switch for disabling selected VCO paths of the wide tuning-range LCPLL of FIG. 3 that might be implemented with thick oxide transistors for high leakage CMOS technologies;

FIG. 9A illustrates variation in loop capacitance versus tuning voltage for a single LCVCO PLL;

FIG. 9B illustrates variation in loop capacitance versus tuning voltage for a dual-LCVCO where one LCVCO is active and one LCVCO is dormant in absence of an embodiment of the present invention;

FIG. 9E illustrates variation in loop capacitance versus tuning voltage for a dual-LCVCO WTR LCPLL in accordance with the present invention with one dormant LCVCO and one active LCVCO;

FIG. 9F illustrates variation in loop capacitance versus tuning voltage for a quad-LCVCO WTR LCPLL in accordance with the present invention with three dormant LCVCOs and one active LCVCO;

DETAILED DESCRIPTION

In accordance with exemplary embodiments of the present invention, as wide tuning-range (WTR) inductive-capacitive (LC) phase locked loop (PLL) provides for a large range of differing oscillation frequencies. The WTR LCPLL comprises a set of individual wide range LC voltage controlled oscillator (VCO) paths. The output of each of the set of individual wide range LCVCO paths is provided to a multiplexor (MUX), whose output is selected based on a control signal from, for example, a device controller. Each of the set of individual wide range LCVCO paths includes a switch that couples the LCVCO to a loop filter of a voltage tuning module, wherein each switch also receives the control signal to disable or enable the LCVCO path when providing the output signal from the MUX. Each switch is configured so as to minimize leakage current drawn by, for example, a thin-oxide varactor (which might typically be used in a high-speed VCO) in the LCVCO to reduce or minimize capacitive loading from the LCVCO varactor that might modulate the loop-filter C2 capacitance when the VCO path is disabled.

A WTR LCPLL operating in accordance with embodiments of the present invention enables wide tuning-range for a given LCPLL implementation, and achieves performances over process, voltage and temperature (PVT) variation comparable to a narrow-band LCPLL. In addition, the WTR LCPLL might achieve relatively high top oscillation frequency comparable to a narrow-band LCPLL, without a capacitive loading penalty from also providing for lower frequency band oscillation signals. A first aspect of the present invention relates to providing for multiple oscillation frequency-bands by the WTR LCPLL using multiple LCVCOs while providing for similar, close to constant loop dynamic performance over PVT as a narrow-band single LCVCO PLL.

Figure 1A:
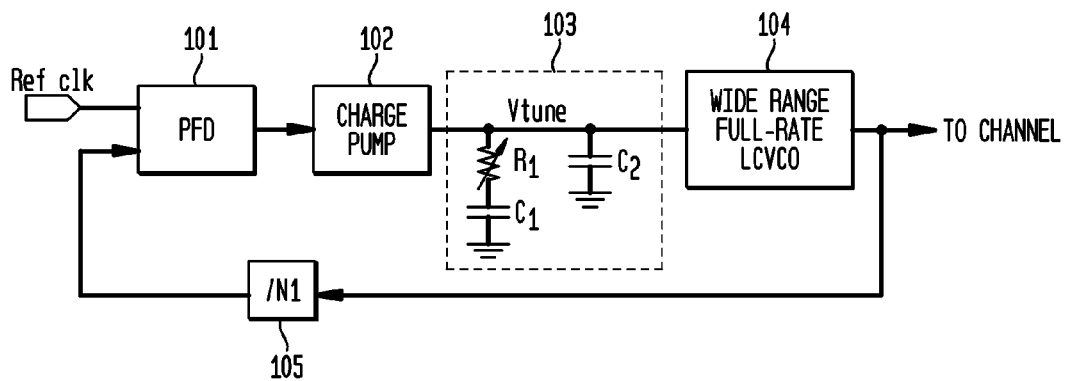
FIG. 1A shows a prior art, single wide range inductive-capacitive (LC) voltage-controlled oscillator (VCO)-based phase-locked loop (PLL)
Figure 1B:
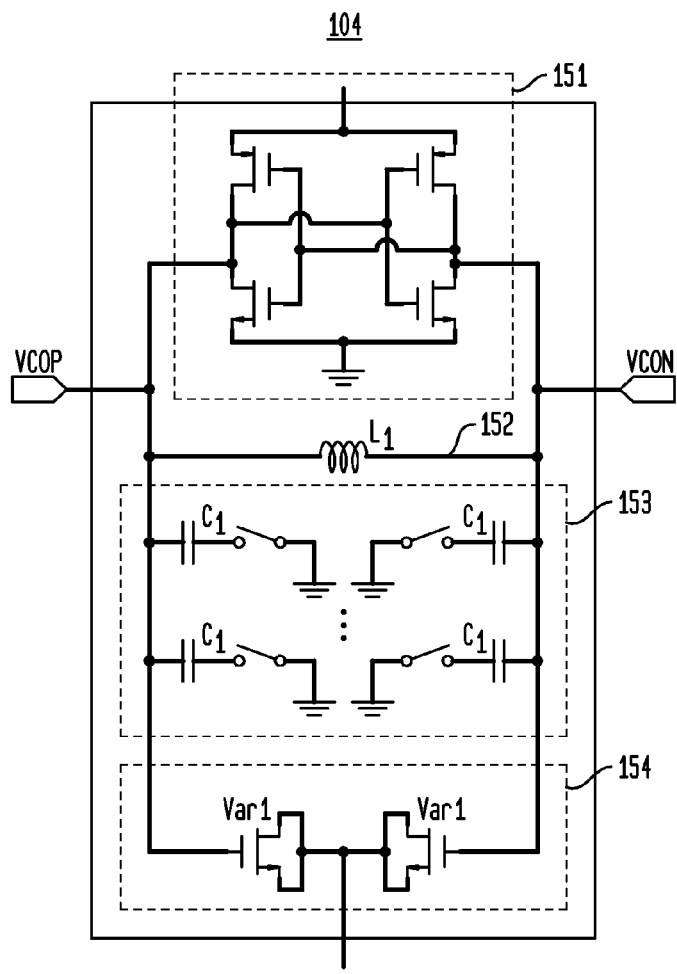
FIG. 1B shows an exemplary circuit implementation for the single, wide-range LCVCO shown in FIG. 1.
Figure 2A:
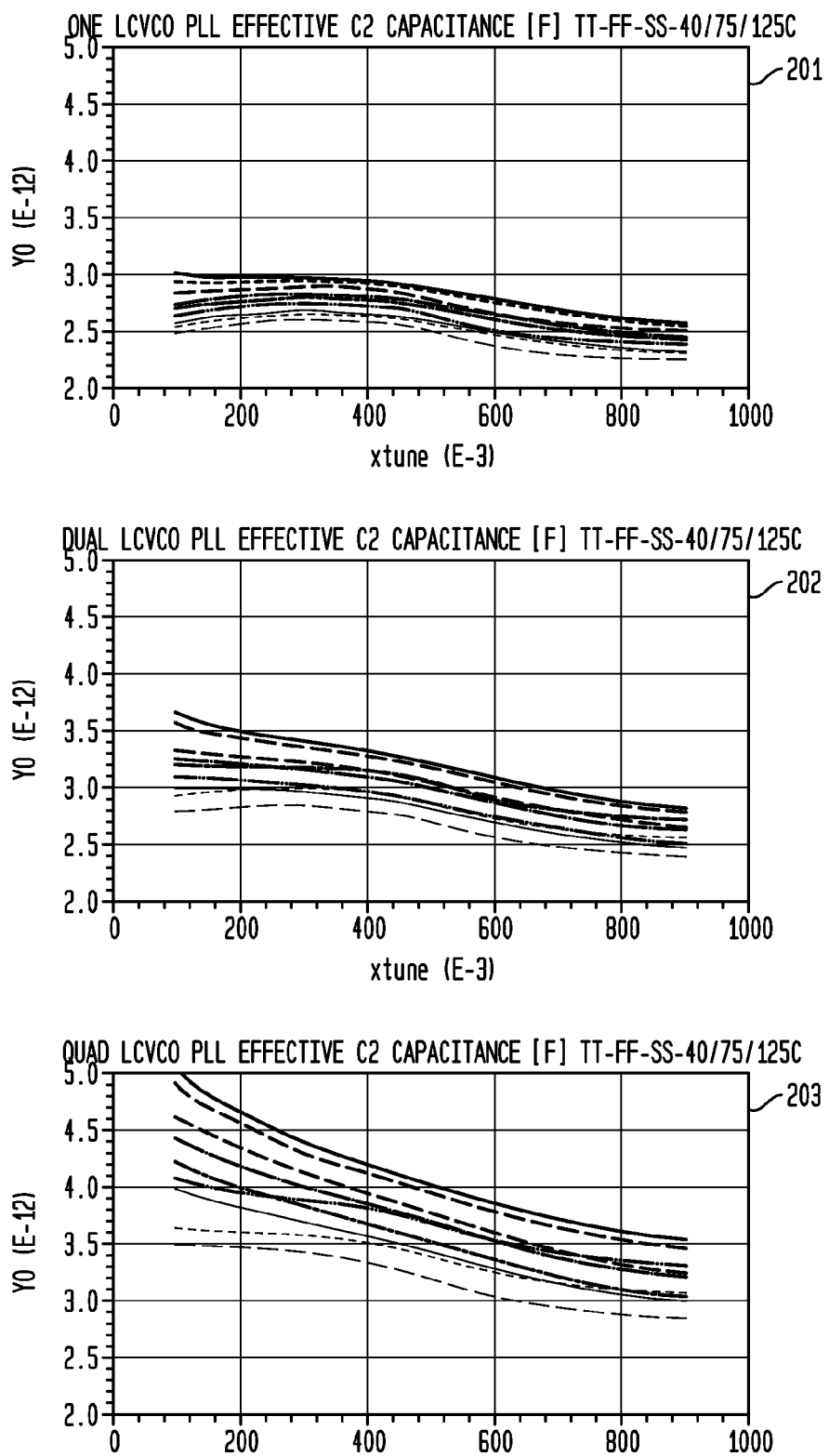
FIG. 2A shows a series of simulation graphs where a single LCVCO PLL is extended to have two LCVCOs and four LCVCOs illustrating variance of effective loop filter C2 capacitance.
Figure 2B:
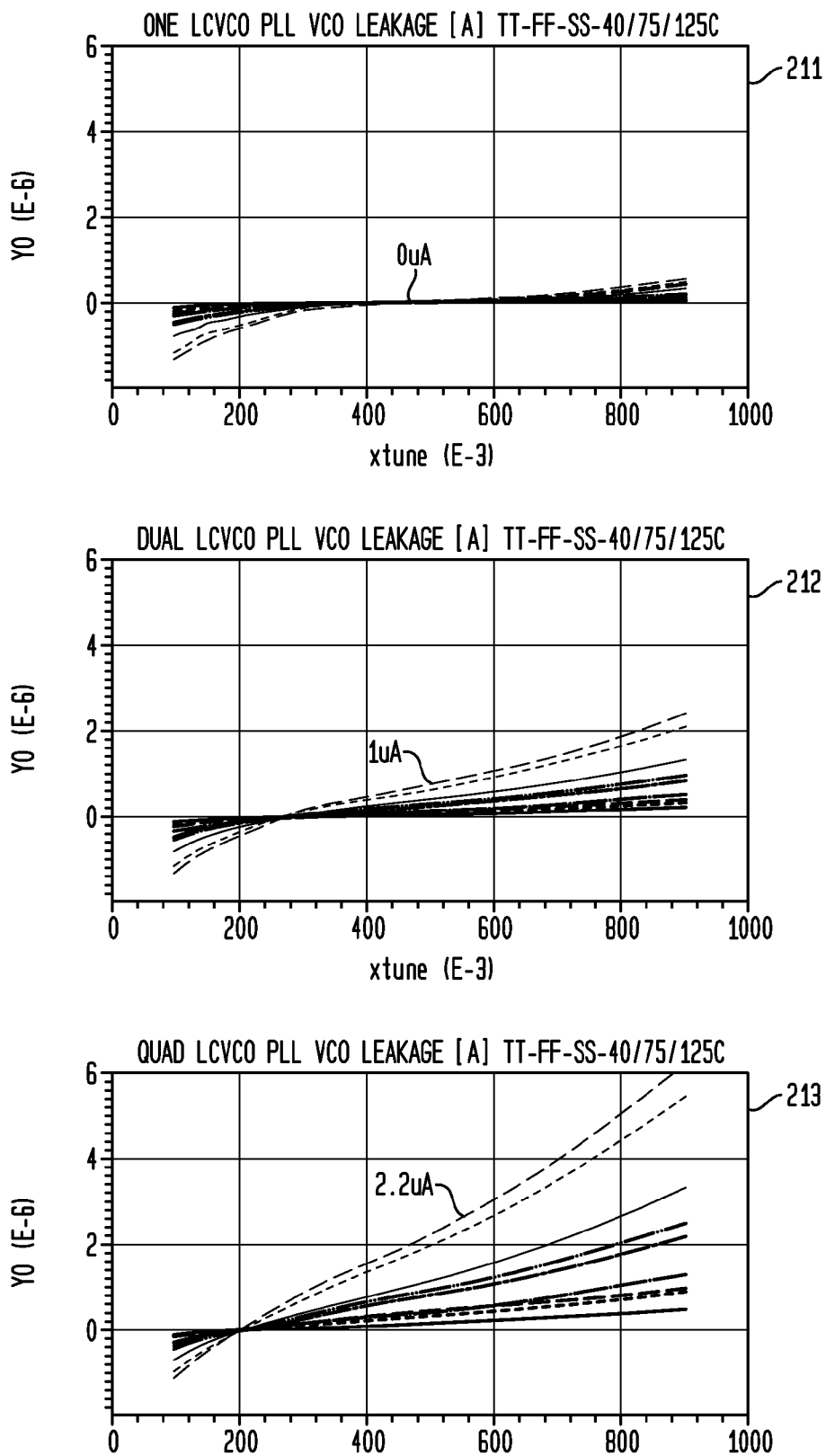
FIG. 2B show a series of simulation graphs where a single LCVCO PLL is extended to have two LCVCOs and four LCVCOs illustrating variance of leakage current from a Vtune node.
Figure 2C:
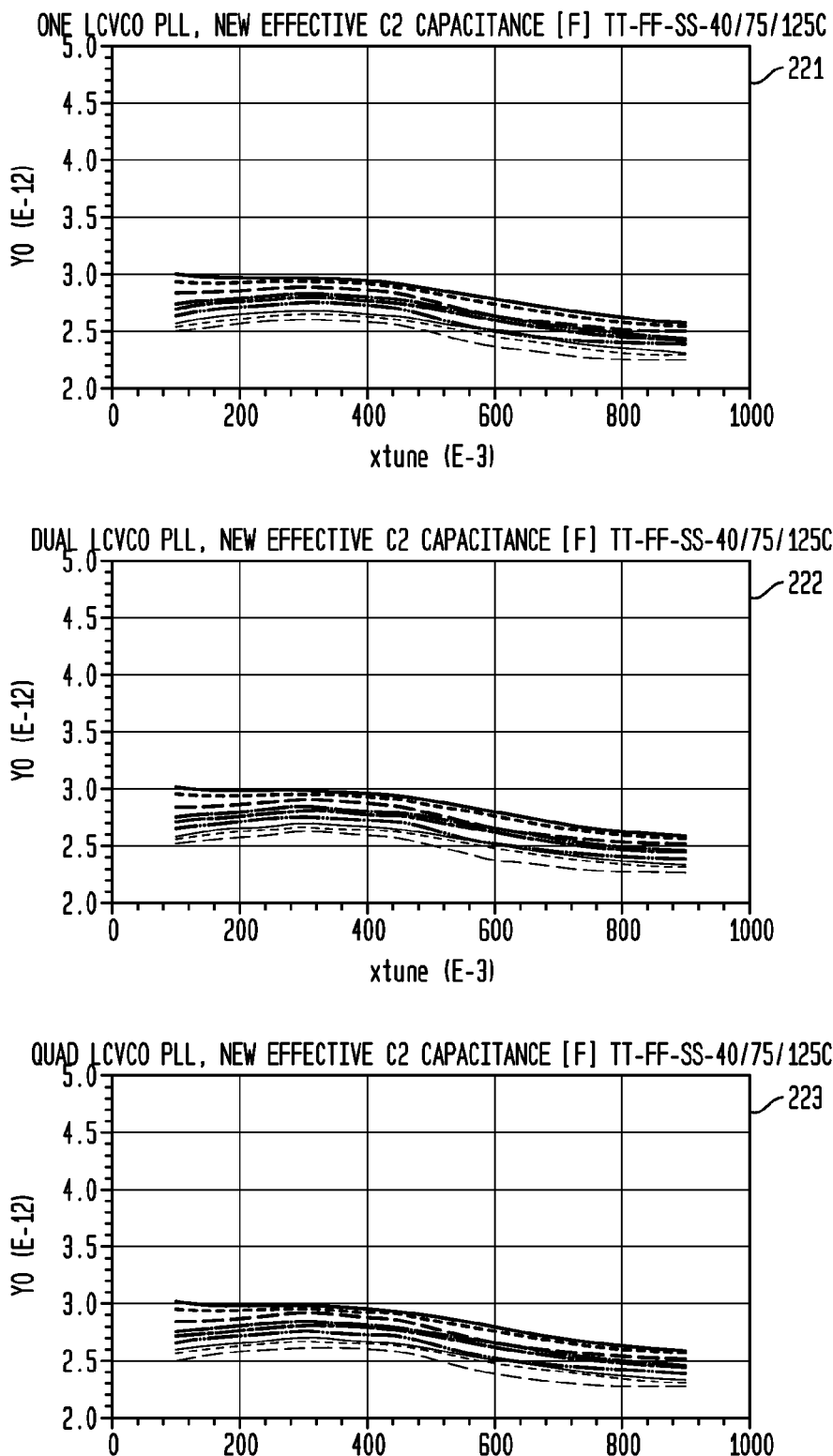
FIG. 2C shows a series of simulation graphs for a single LCVCO PLL, a dual LCVCO PLL and a quad LCVCO PLL in accordance with embodiments of the present invention illustrating variance of effective loop filter capacitance under similar conditions as those of FIG. 2A.
Figure 2D:
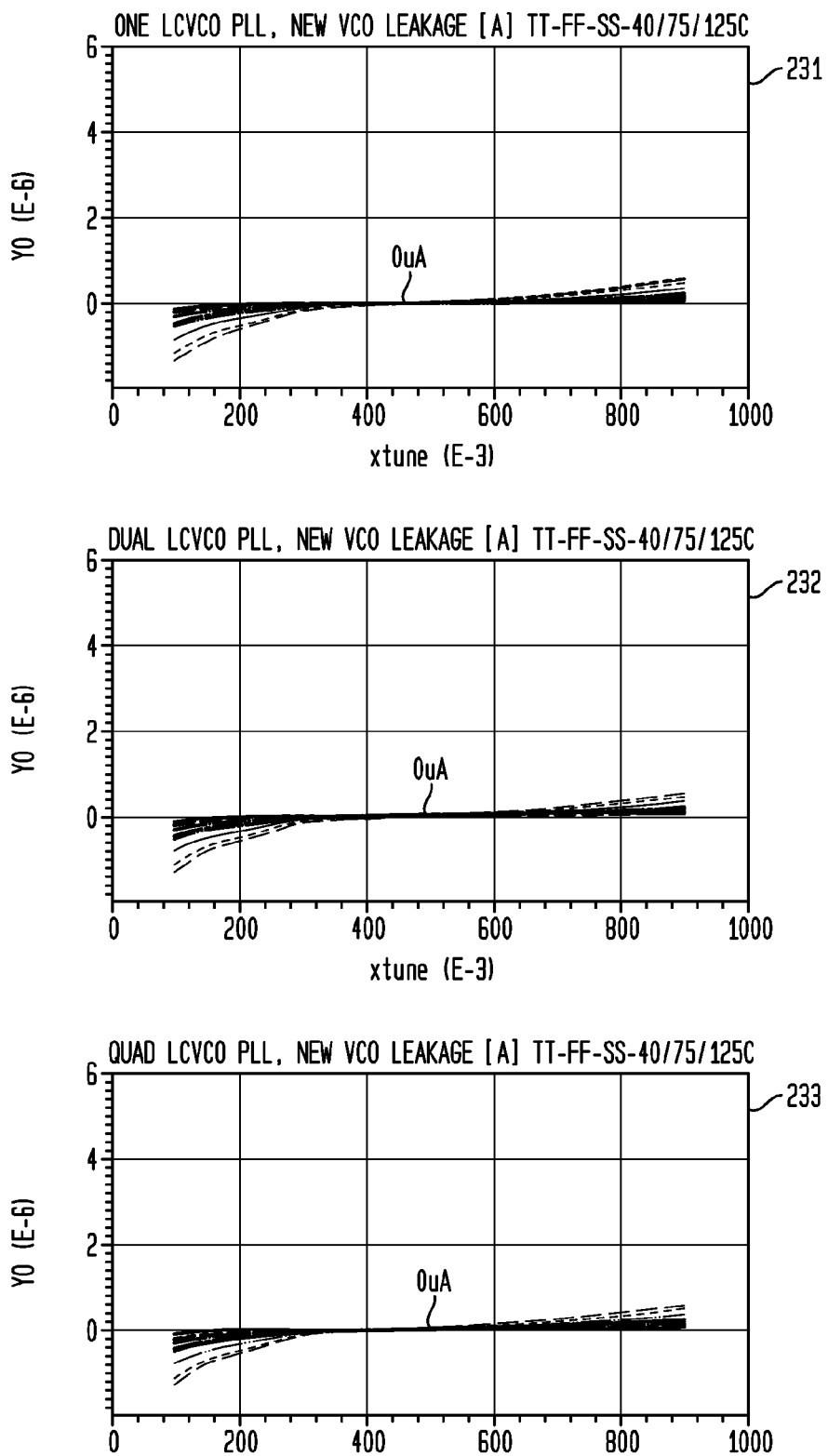
FIG. 2D shows a series of simulation graphs for a single LCVCO PLL, a dual LCVCO PLL and a quad LCVCO PLL in accordance with embodiments of the present invention illustrating variance of leakage current under similar conditions as those of FIG. 2B.

The inventors recognize a problem of effective loop filter capacitance and leakage current variations in direct expansion by increasing the tuning range of a PLL with separate, added LCVCO circuits in which dormant LCVCO circuits are turned off or otherwise disabled. As a solution, the inventors' WTR LCPLL operating in accordance with embodiments of the present invention enables wide tuning-range for a given LCPLL implementation, while minimizing the effective loop filter capacitance and leakage current variations. FIGS. 2A and 2B illustrate the problem of direct expansion. FIG. 2A shows a series of simulation graphs where a single LCVCO PLL 201 is extended to have two LCVCOs (a dual LCVCO PLL 202) and four LCVCOs (a quad LCVCO PLL 203) illustrating variance of effective loop filter capacitance (or "C2" capacitance, as described in detail below) versus loop filter tuning voltage ("vtune"). FIG. 2B shows a series of simulation graphs thr a single LCVCO PLL 211, a dual LCVCO PLL 212 and a quad LCVCO PLL 213 illustrating variance of leakage current loop filter tuning voltage ("vtune"). FIGS. 2C and 2D illustrate that a WTR LCPLL operating in accordance with embodiments of the present invention solves this problem of variance of effective loop filter capacitance. FIG. 2C shows a series of simulation graphs for a single LCVCO PLL 221, a dual LCVCO PLL 222 and a quad LCVCO PLL 223 in accordance with embodiments of the present invention illustrating variance of effective loop filter capacitance versus loop filter tuning voltage ("vtune") under similar conditions as those of FIGS. 2A and 2B. FIG. 2D shows a series of simulation graphs for a single LCVCO PLL 231, a dual LCVCO PLL 232 and a quad LCVCO PLL 233 in accordance with embodiments of the present invention illustrating variance of leakage current versus loop filter tuning voltage ("vtune") under similar conditions as those of FIGS. 2A and 2B.

Figure 3:
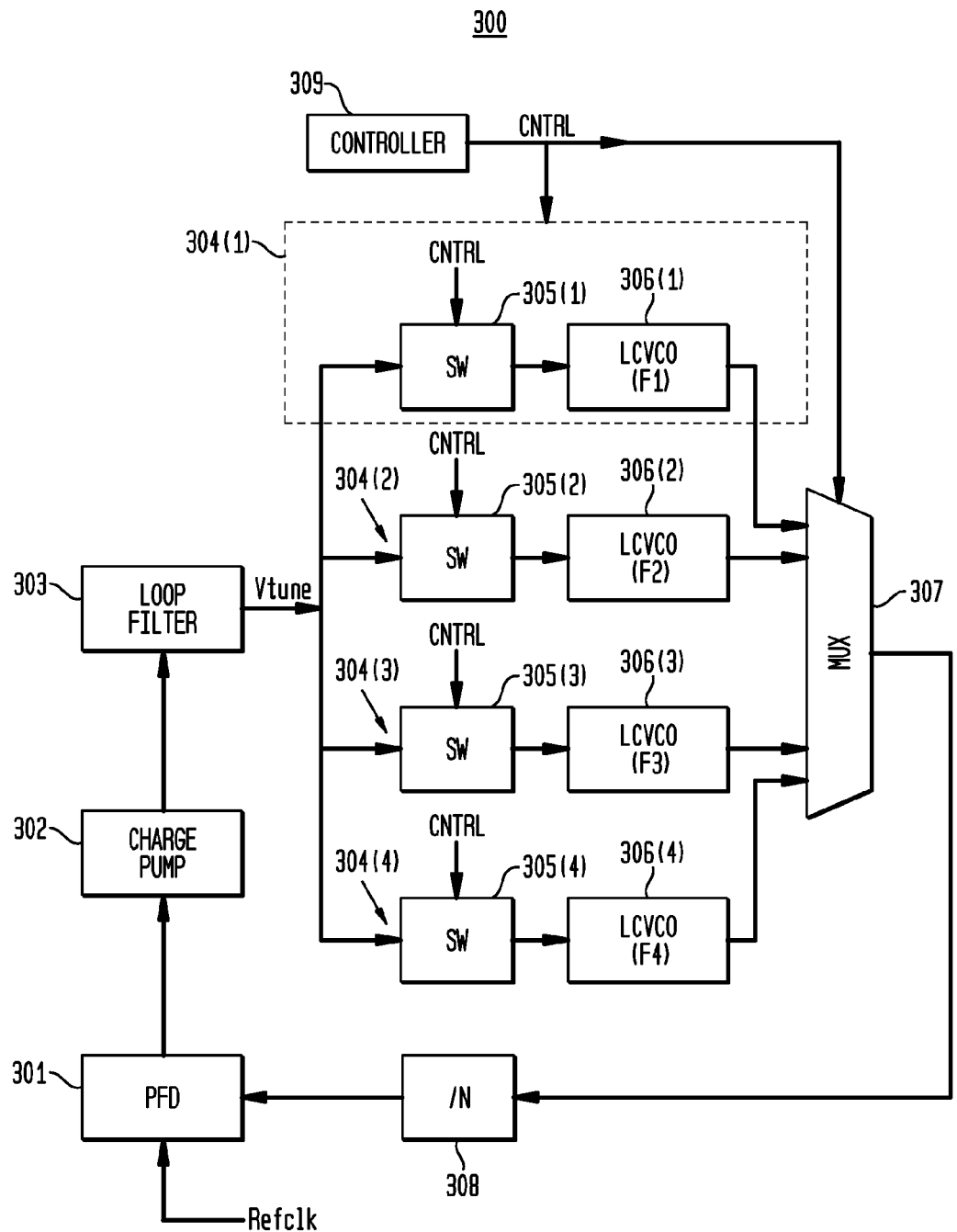
FIG. 3 shows an exemplary embodiment of wide tuning-range (WTR) LCPLL employing multiple VCOs operating in accordance with the present invention.

FIG. 3 shows an exemplary embodiment of WTR LCPLL 300 employing multiple VCOs operating in accordance with the present invention. WTR LCPLL 300 comprises phase frequency detector (PFD) 301, charge pump 302, and loop filter 303, which provides voltage Vtune to set the oscillation of a VCO. WTR LCPLL 300 further comprises LCVCO paths 304(1)-301(4). Each of LCVCO paths 304(1)-301(4) includes corresponding switch and VCO operating at a given oscillation frequency. For example, LCVCO path 304(1) comprises switch (SW) 305(1) and LCVCO 306(1) (operating with oscillation frequency (F1)). Each of LCVCOs 306 (1)-306(4) provides clock signal to the channel over one of a set of multiple desired oscillation frequency bands. In addition, each of LCVCOs 306(1)-306(4) might comprise a VCO, followed with a level shifter, divider (e.g., divide-by-2 counter) and/or output buffer (not shown in FIG. 3) for the VCO output signal for various clock signal applications.

WTR LCPLL 300 further comprises multiplexer (MUX) 307, optional counter (divide-by-N) 308, and device controller 309. Controller 309, coupled to MUX 307 and each of SWs 305(1)-305(4), generates control signal CNTRL to select as output for WTR LCPLL 300 the output of one of the LCVCO paths 304(1)-301(4). Controller 309 might be implemented with a processor and software, or might be implemented as a simple state machine with corresponding state table for signal CNTRL. While FIG. 3 shows four LCVCO paths, the present invention is not so limited. One skilled in the art might employ less or more than four LCVCO paths based upon the teachings herein.

A lower frequency reference clock (Refclk) and a scaled version of the output from MUX 307 is applied to PFD 301, which generates an error signal proportional to the difference between its input signals. Based on this error signal, charge pump 302 increases or decreases charge applied to the loop filter 303 to produce Vtune. Charge from charge pump 302 appears as a voltage Vtune that controls the oscillation frequency of a corresponding one of LCVCOs 306(1)-306(4) when enabled through action of CNTRL applied to a corresponding one of SWs 305(1)-305(4). The selected output signal from MUX 307 is provided to counter 308, which scales the output frequency by N, which scaled signal is then provided to PFD 301.

The multiple LCVCO paths each require small tuning range for each of its VCOs, yielding relatively good jitter performance. High frequency oscillation is achieved by relieving the LCVCO capacitive loading from large switched-capacitor banks incorporated into the circuits of the LCVCOs. This provides for a high-speed design. As described above, the LCVCO might incorporate a level shifter, a divider, and output buffers. LCVCO output frequencies might be divided by 2 with a counter before multiplexing. The divide-by-2 circuit might be individually tailored for the LCVCO coupled to it, when the frequencies from the multiple LCVCO paths are widely different. This divide by 2 operation also provides half-rate quadrature clocks naturally to the channel, which might satisfy the clocking needs for TX and RX phase-interpolation simultaneously. Buffers might act as repeaters for the clock distribution between various circuit component blocks. Disabled or otherwise dormant LCVCO paths might be powered down, reducing power consumption. Inductors are relatively small geometry for 10-30 GHz or even higher frequency oscillation, allowing for incorporation of multiple LCVCO paths in an SoC implementation of the WTR LCPLL.

FIG. 4A shows an exemplary embodiment of a loop filter 303 of WTR LCPLL 300 of FIG. 3. FIG. 4B shows an exemplary thick and thin film transistor type notation as employed in FIG. 4A and in subsequent FIGs. As would be apparent to one skilled in the art, as CMOS processing migrates to smaller and smaller geometries, the oxide thicknesses that are considered 'thick' or 'thin' that provide the same functions will not necessarily be the same thickness ("e.g., approximately 18 A") as at the described geometry herein of 40 nm.

Returning to FIG. 4A, loop-filter 303 comprises resistors $R_1$ and $R_{on}$, and capacitors $C_1$, $C_2$, $C_p$, $C_{pfix}$, and optional $C_3$. Besides (i) series combination of resistance $R_1$ and capacitance $C_1$ (ii) in parallel with capacitor $C_2$, loop filter 303 includes capacitance $C_{pfix}$ that represents the grouped routing capacitance and the capacitance from the disabled (or, dormant) LCVCO paths, the T-gate on-resistance $R_{on}$ (from the switch of the LCVCO path that is enabled), and the input capacitance $C_p$ seen at the input of the operating LCVCO. The loop-filter might be designed as a filter second order by placing the extra pole formed by the $R_{on}$ and $C_p$ far away from the ripple capacitance pole of the loop filter. An optional capacitor $C_3$ can also be added after a T-gate of the switch (described subsequently) to further suppress noise, and making the loop-filter a $3^{rd}$ order loop filter.

The multi-LCVCO PLL open-loop gain G(s) might be as given in equation (3):

$$G(s) = \frac{Icp \cdot L}{4\pi N} \cdot \frac{R + \frac{1}{sC_1}}{R \cdot sC_2 + \frac{C_2}{C_1} + 1} \cdot \frac{\omega_{osc}^3}{s} \cdot \frac{\partial C_{var}}{\partial V_{tune}} \quad (3)$$

where $\omega_{osc}$ is the oscillation frequency, R is the resistance for R1, $C_1$ and $C_2$ are as shown in FIG. 4A, L is the inductance of the LCVCO tank circuit, $C_{var}$ is the varactor capacitance seen by the LCVCO tank circuit, $V_{tune}$ is the output voltage of the loop filter, and Icp is charge pump current. Varactor capacitance seen at the Vtune node is largely different from, and usually much larger than the varactor capacitance seen by the LCVCO for oscillation purposes, which is seen in differential mode from the output nodes. In the context here, $C_{var}$ is the capacitance seen for oscillation purposes. Given equation (3), a particular SoC design might set the loop-filter characteristics close to that of a single LCVCO PLL. In a particular SERDES application, the nominal data rate, and therefore the PLL frequency, is fixed. An automatic multi-LCVCO frequency calibration engine might be incorporated into a given implementation design to limit the tuning voltage range, and also bias the varactors and charge-pump in their linear regions. As a result, close to constant loop dynamic might be achieved for a chosen PLL setting over PVT.

FIG. 5 shows an exemplary embodiment of switch 305(1) (other switches, e.g., SWs 305(2)-305(4), might be implemented in a similar manner and operate analogously) for disabling or enabling selected LCVCO paths of WTR LCPLL 300 of FIG. 3. In accordance with exemplary embodiments of the present invention, switch 305(1) is an impedance switch, which as shown in FIG. 5 might be implemented as T-gate 500. Based on the control input signal SEL1, switch 305(1) is enabled or disabled, corresponding to a low-impedance ("ON") or a high impedance ("OFF"), respectively. Based on a control signal SEL1 (within control signal CNTRL from controller 309), switch 305(1) couples Vtune of loop filter 308 to LCVCO 306(1) when LCVCO 306(1) is selected to provide the output oscillation signal. Concurrently, T-gates of SWs 305(2)-305(4) might set their impedances to high (OFF) to isolate the loop filter from the loading capacitances of these now dormant LCVCOs.

T-gate 500 might be realized as a circuit including one N-type transistor ($M_n$) and one P-type transistor ($M_p$) connected in parallel and controlled by inverted gate voltages (i.e., control signal SEL1 is a differential signal). This combination of N-type and P-type transistors allows for efficient switching. If the gate voltage of the N-type transistor is ground ("GND"), the P-type transistor has a gate voltage of Vdd and both transistors are non-conducting. On the other hand, if the gate voltage of the N-type transistor is Vdd and the gate voltage of the P-type transistor is GND, both transistors are conducting. If the source voltage is near Vdd, there is a voltage drop across the N-type transistor but (almost) no voltage drop across the P-type transistor. If the source voltage is near GND, the N-type transistor has (almost) no voltage drop.

Figure 6:
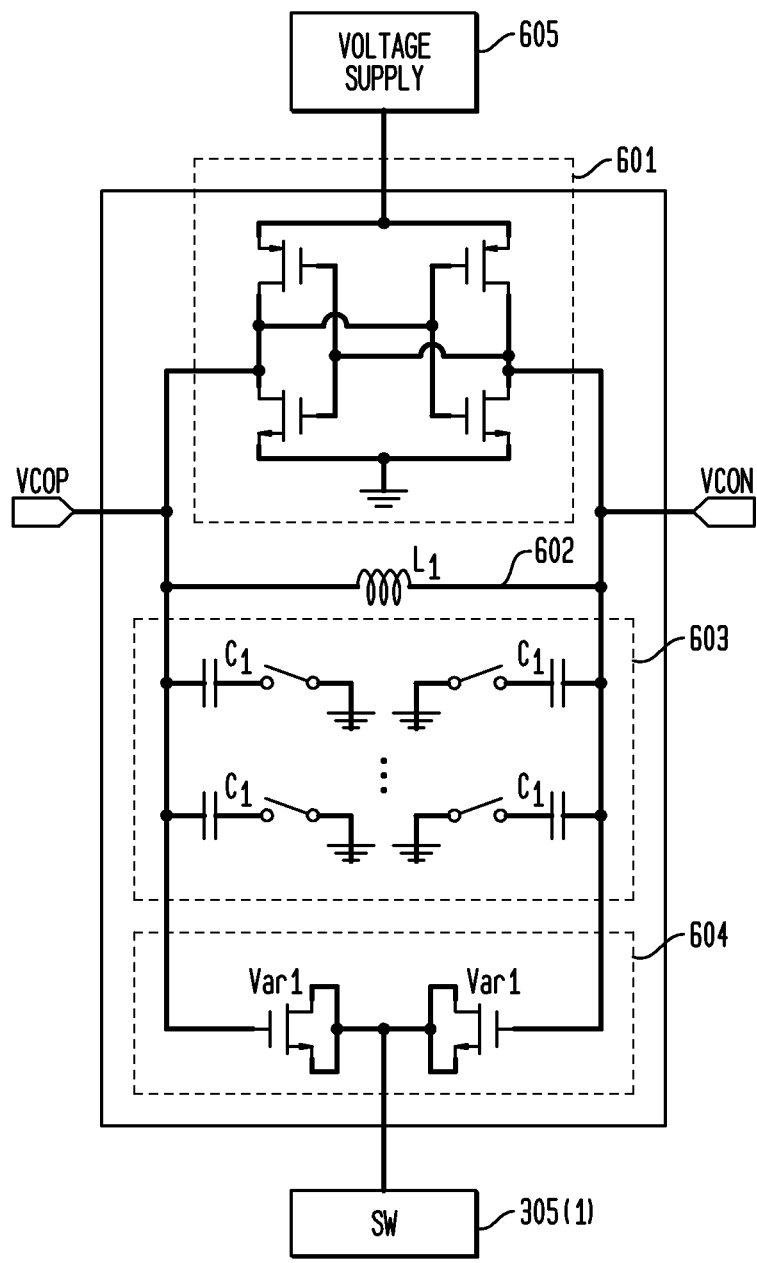
FIG. 6 shows an exemplary circuit implementation for LCVCO of FIG. 3.

FIG. 6 shows an exemplary circuit implementation for LCVCO 306(1) (other LCVCOs, e.g., LCVCOs 306(2)-306(4), might be implemented in a similar manner and operate analogously). LCVCO 306(1) is implemented as a complimentary cross-coupled VCO architecture. LCVCO 306(1) comprises a cross-coupled differential amplifier 601 with an LC tank in its feedback path. This LC tank is composed of inductance provided by inductor 602 (with exemplary inductive value L1) and a capacitance provided by parallel coupled varactors 604 (with exemplary capacitive values Var1) and switched capacitor banks 603 (with exemplary capacitive values $C_1$) that extend the tuning range of the VCO. LCVCO 306(1) is driven by low-noise voltage supply 605.

Figure 7:
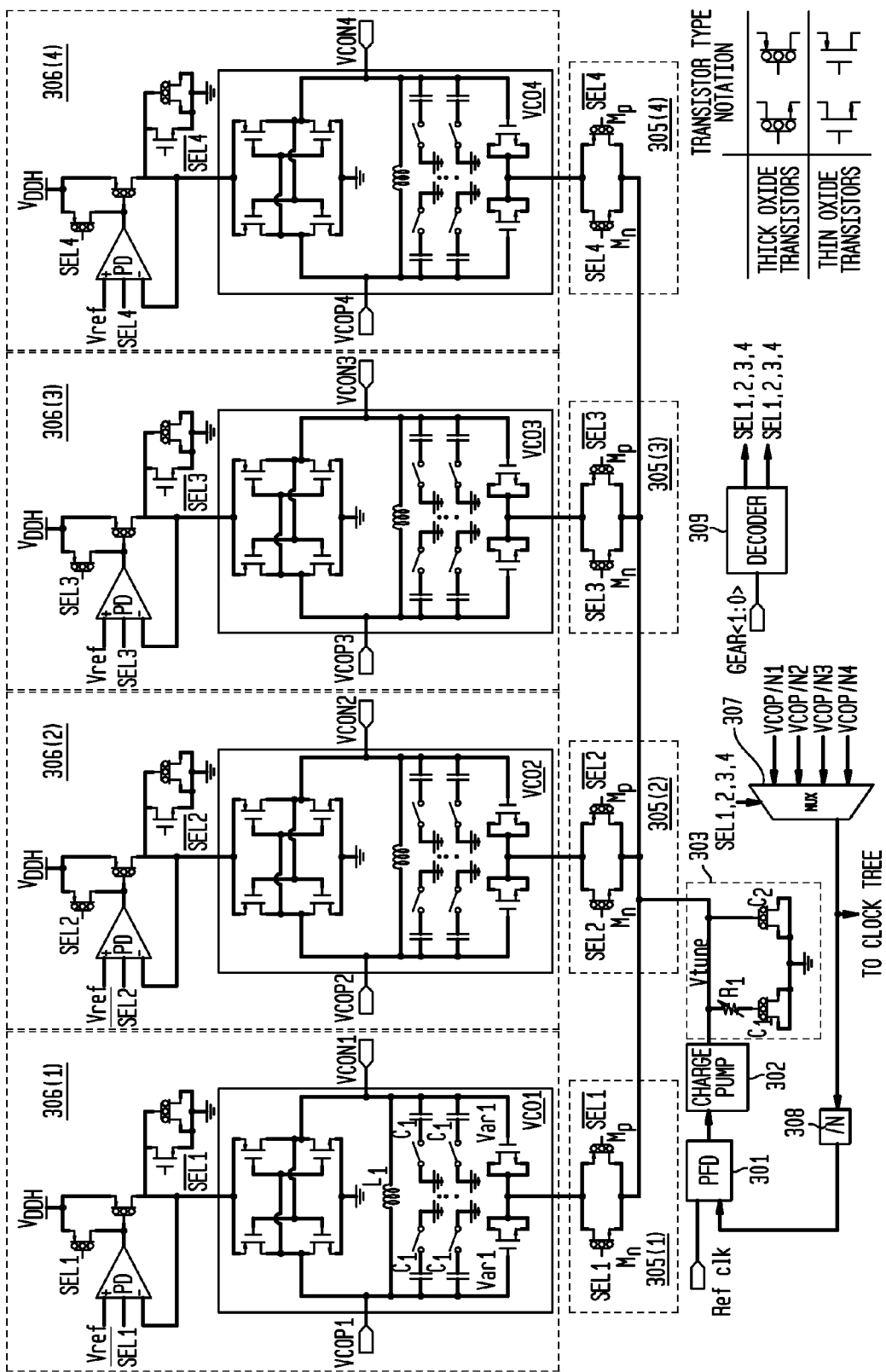
FIG. 7 shows an exemplary circuit implementation for the single, wide-range LCVCO shown in FIG. 3.

FIG. 7 shows an exemplary circuit implementation for the single, wide-range LCVCO shown in FIG. 3. As shown, disabling not only occurs through operation of selected ones of SWs 305(1)-305(4), but also through selectively disabling the voltage supply circuitry of each of corresponding selected ones of LCVCOs 306(1)-306(4). Therefore, each dormant LCVCO is completely isolated from the active LCVCO and PLL loop.

Several factors influence the selection of the T-gate for implementations for embodiments of the present invention, and use of such T-gate significantly enables a multi-VCO configuration within a confined SoC silicon space circuit layout. Most notably, i) leakage current effects from dormant LCVCOs and ii) modulation effects from the capacitance of the SoC circuit design's loop filter interacting with the input capacitance of multiple dormant (disabled) LCVCOs substantially degrade operation and stability of a circuit design that simply combines several VCOs and selective enables and disables them.

For modulation effects, the value of the loop-filter ripple-capacitor $C_2$ (see, e.g., FIG. 4 and in light of equation (3) above) dominates variations in the PLL loop-dynamics, such as jitter peaking and loop stability. The PVT variation of the intentional $C_2$ capacitor built from a thick oxide transistor tracks with the $C_1$ capacitor built from the same device in a single LCVCO. However, when used in conjunction with multiple LCVCOs, the effective $C_2$ capacitance, which is the combined value of the intentional $C_2$ and the input capacitance values from the LCVCOs, varies substantially. The variance increases with an increase in the number of dormant LCVCOs. The equivalent $C_2$ value experiences excessive variation and does not track the capacitance $C_1$, reducing the circuit's ability to maintain reasonable jitter performance over PVT, and possibly PLL loop stability.

Use of T-gate 500 provides for two important factors enabling a multiple VCO circuit configuration in accordance with exemplary embodiments of the present invention. First, use of T-gate 500 might substantially reduce leakage current from each dormant VCO. Second, and more importantly, use of T-gate 500 might substantially reduce effects of the capacitance of each dormant VCO on the fixed $C_2$ capacitance of the loop filter. Since each dormant VCO's capacitance combines with the $C_2$ capacitance and changes the effective $C_2$ capacitance of the loop filter, adding T-gate 500 isolates the loop filter's $C_2$ capacitance value, thereby allowing for a particular SoC design to set the loop-filter characteristics close to that of a single LCVCO PLL.

For high leakage semiconductor process chips, such as 40 nm CMOS, the T-gate that controls the LCVCO input can be implemented with thick-oxide transistors (e.g., approximately 18 A) for relatively large OFF to ON resistance ratio. In addition, the P and N transistor ratio is desirably sized such that a consistent ON resistance appears over the range of Vtune voltage changes. When leakage current drawn is not significant, small thin oxide transistors might also be used. The mechanism for reducing the leakage current drawn by the dormant LCVCO is as follows: the large OFF-resistance added in the path creates a voltage drop. The varactor leakage drops exponentially with the decrease of its top-bottom voltage difference. The leakage current continues to drop until a new balance of the voltage divider is obtained from the Vtune node formed by the T-gate OFF-resistance and the varactors.

For leakage current effects, in PLL design, the leakage current from the loop filter output (Vtune) node might lead to a Vtune voltage drop before the charge-pump recovers, resulting in periodic jitter at the output of the WTR LCPLL. Relatively high leakage current reduces the circuit's ability to maintain reasonable periodic jitter performance and, in some cases, loss of PLL lock when small charge-pump current and large feedback divider ratio are used. The leakage current might occur from three paths: the loop-filter capacitors; charge-pump up/down current mismatch; and LCVCO varactors. The loop-filter capacitors might be constructed using thick oxide-transistors (e.g., approximately 18 A), where gate leakage is relatively low. Charge-pump current matching might be improved by avoiding operation of the WTR LCPLL with extreme Vtune voltages that cause at least one side of the charge-pump triode. Gate leakage from varactors of the LCVCO might be, however, a dominant factor. RF varactors are typically implemented as n+ in n-well accumulation MOS capacitors, where the gate leakage increases as the geometry of the technology decreases. In 40 nm geometry CMOS technology, for example, very high gate-leakage current of 100 nA per um$^2$ might occur. In an operating LCVCO, the back-to-back varactors somewhat compensate each other. In a dormant LCVCO, however, the leakage drawn from the Vtune node by the two varactors is in the same direction, and adds together. Therefore, leakage through a dormant VCO is a strong function of Vtune, and is possibly relatively large in 40 nm geometry CMOS technology, and might increase with the number of VCOs. Consequently, the use of a T-gate as a switch at the Vtune node to create high impedance and relative isolation for dormant LCVCOs is preferred.

Figure 8A:
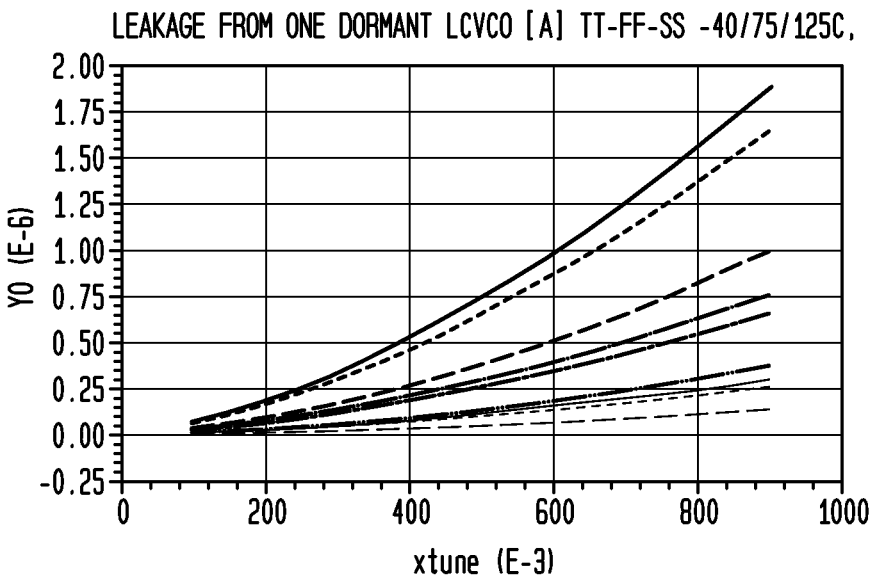
FIG. 8 shows two graphs that compare leakage drawn from a voltage tuning module of by one dormant LCVCO with and without the switch of FIG. 5 in accordance with a first aspect of the present invention.
Figure 8B:
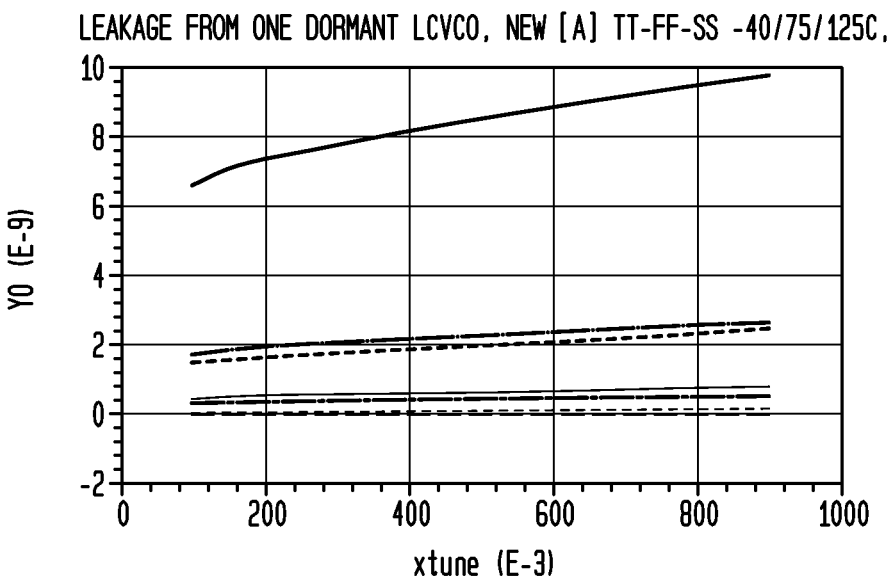

FIG. 8 shows two graphs that compare (A) a graph of leakage drawn from Vtune by one dormant LCVCO without the switch of FIG. 5, with (B) a graph of leakage drawn from Vtune by one dormant LCVCO with the switch of FIG. 5. As shown in graph (B) of FIG. 8, the leakage current drops to less than 10 nA, and is a 200 times reduction compared with graph (A) of FIG. 8. The $C_2$ contribution from a dormant VCO is also suppressed by the T-gate OFF-resistance. The varactor leakage current from the Vtune node is small, has relatively small increase as the number of LCVCOs increases and might be considered negligible. In addition, the combined T-gate and the VCO input capacitance is reduced to less than 20 fF and might be considered negligible.

As shown in FIG. 8, with a multiple LCVCO configured WTR LCPLL operating in accordance with embodiments of the present invention, the total $C_2$ capacitance and its variation are small with voltage and temperature change, and has negligible increase as the number of LCVCOs increases. The total $C_2$ capacitance and its variation are comparable to single, narrowband LCVCO implementation, even for a quad-LCVCO configuration. WTR LCPLL with a quad-LCVCO configuration also has loop characteristic, jitter peaking and random jitter performance comparable to single, narrowband LCVCO implementation. In addition, the varactor leakage current from Vtune is small, and does not increase much with the increase of the number of VCOs.

FIGS. 9A through 9F compare simulation results for total $C_2$ capacitance and its variation for a single LCVCO PLL, a dual-LCVCO PLL and a Quad-LCVCO PLL over varying PVT with direct extension and implementations in accordance with embodiments of the present invention. FIGS. 9A through 9F plot total $C_2$ capacitance (fixed $C_2$ capacitor value plus added dormant LCVCO capacitance) versus VCO tuning control voltage Vtune from the loop filter. Such simulations are performed based on a 40 nm geometry with the fixed value $C_2$ capacitor constructed from an 18 A thick oxide transistor. Graph plots are constructed as for temperature values of −40 C, 75 C and 125 C for TT, FF and SS process corner cases.

A process corner represents a three or six standard deviation variation from nominal doping concentrations in the transistors on a silicon wafer designed with a given SoC circuit geometry process. The variation from nominal doping might cause significant changes in the duty cycle and slew rate of digital signals passing through the circuit. The process corner is defined by the SoC IC circuit process design libraries of a given manufacturer. Process corners use two-letter designators, where the first letter refers to the NMOS corner, and the second letter refers to the PMOS corner. In this naming convention, three corners exist: typical, fast and slow. Fast and slow corners exhibit carrier mobilities that are higher and lower than normal, or "typical", respectively. For example, a corner designated as FS denotes fast NFETs and slow PFETs. Such corners are induced through variation in drive and threshold voltages of the FETs. The first three corners TT, FF, and SS are termed "even" corners, because both FET devices are evenly affected evenly, and generally do not adversely affect the logical correctness of the circuit.

Figure 9C:
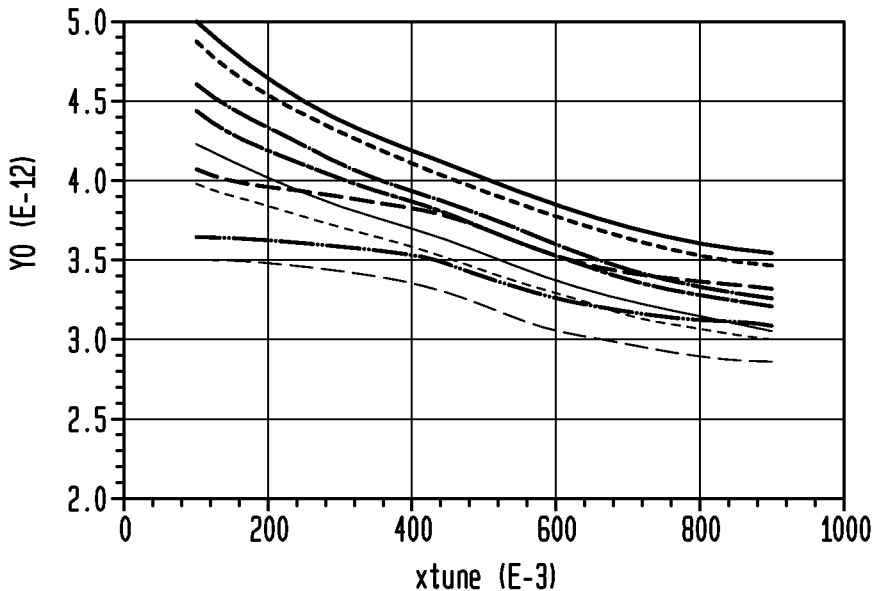
FIG. 9C illustrates variation in loop capacitance versus tuning voltage for a quad-LCVCO where one LCVCO is active and three LCVCOs are dormant in absence of an embodiment of the present invention.

FIG. 9A illustrates variation in $C_2$ capacitance versus Vtune for a single LCVCO. As such, the graph of FIG. 9A provides a baseline of operation for a single, narrowband LCVCO implementation. In contrast, FIG. 9B illustrates the operation when the PLL includes two (or "dual") LCVCOs with one dormant LCVCO and one active LCVCO. As shown in FIG. 9B, $C_2$ capacitance begins to vary over PVT when compared to the single LCVCO case of FIG. 9A. FIG. 9C illustrates the operation when the PLL includes four (or "quad") LCVCOs with three dormant LCVCOs and one active LCVCO, and shows that $C_2$ capacitance varies even more over PVT than the dual-LCVCO case of FIG. 9B.

Figure 9D:
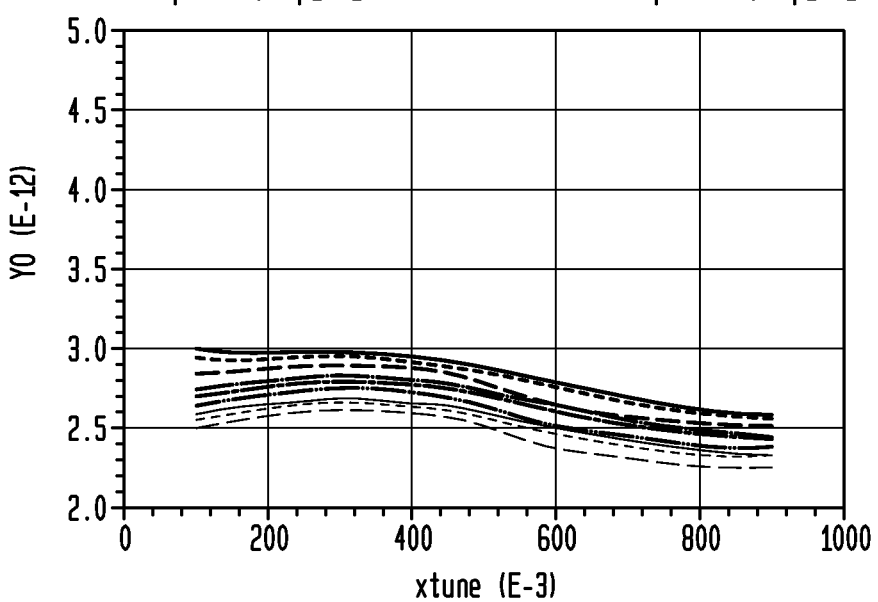
FIG. 9D illustrates variation in loop capacitance versus tuning voltage for a single LCVCO PLL implemented with the circuit of FIG. 7.

FIG. 9D illustrates variation in $C_2$ capacitance versus Vtune for a single LCVCO circuit implemented with the circuit of FIG. 7. As such, when compared to the graph of FIG. 9A, the single LCVCO circuit in accordance with embodiments of the present invention is comparable to the baseline of operation for a single, narrowband LCVCO implementation. FIG. 9E illustrates the operation when the WTR LCPLL in accordance with the present invention includes two (or "dual") LCVCOs with one dormant LCVCO and one active LCVCO. As shown in FIG. 9E, $C_2$ capacitance varies little over PVT when compared to the baseline of operation for a single, narrowband LCVCO implementation shown in FIGS. 9A and 9D. FIG. 9F illustrates the operation when the PLL includes four (or "quad") LCVCOs with three dormant LCVCOs and one active LCVCO. As shown by comparing the graphs of FIGS. 9E and 9F, $C_2$ capacitance variance is negligible between dual-LCVCO and quad-LCVCO circuit cases, and substantially equivalent to the single LCVCO case of FIG. 9D.

A second aspect of the present invention relates to providing for multiple oscillation frequencies by the WTR LCPLL using multiple VCOs within a confined SoC silicon circuit layout through circuit elements of relatively narrow frequency range operation. As is known, circuit elements might exhibit relatively narrow range of oscillation frequencies for a preferred operation characteristic, but, by definition, the WTR LCPLL advantageously provides oscillation frequencies over a relatively wide range of oscillation frequencies. Consequently, the circuit configurations of FIGS. 3 and 7, for example, might be modified as follows to enable such second aspect. First, as noted previously, each LCVCO paths of WTR LCPLL 300 might include one or more dividers (and possibly corresponding buffers) to generate one or more additional, differing oscillation frequencies from the LCVCO's output signal at the LCVCO's given oscillation frequency. Second, the MUX employed to select desired output oscillation frequency signals might be implemented as two or more MUXs. Each MUX receives either direct or divided oscillation frequencies within its operating frequency range. Consequently, CNTRL signal of FIG. 3 is modified to enable proper selection of output signals using several MUXs. For example, such modification might be employed if each MUX operates over a relatively narrow frequency band.

Figure 10:
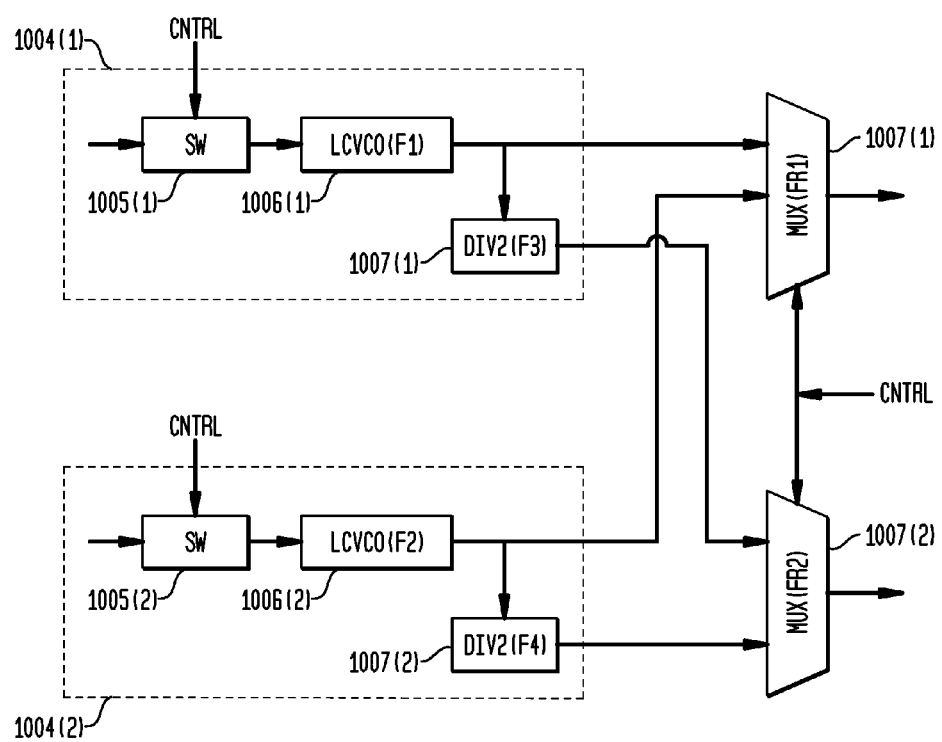
FIG. 10 shows a WTR LCPLL using multiple VCOs and having multiple multiplexors in accordance with a second aspect of the present invention.

A block diagram illustrating this second aspect of the present invention is shown in FIG. 10. Two LCVCO paths 1004(1) and 1004(2) are shown. Each of LCVCO paths 1004(1) and 1004(2) has a corresponding one of LCVCOs 1006(1) and 1006(2) that is enabled by a corresponding one of switches SW 1005(1) and 1005(2). LCVCO 1006(1) operates at a first oscillation frequency F1 and LCVCO 1006(2) operates at a second oscillation frequency F2. Oscillation frequencies F1 and F2 are within a first frequency range FR1 supported by circuitry of MUX 1007(1).

Each of LCVCO paths 1004(1) and 1004(2) further includes a corresponding one of dividers DIV1 1007(1) and DIV2 1007(2). DIV1 1007(1) is a divide-by-2 counter that divides the oscillation frequency of the output of LCVCO 1006(1) in half to oscillation frequency F3. Similarly, DIV2 1007(2) is a divide-by-2 counter that divides the oscillation frequency of the output of LCVCO 1006(2) in half to oscillation frequency F4. Oscillation frequencies F3 and F4 are within a second frequency range FR2 supported by circuitry of MUX 1007(2). The use of divide-by-2 counters herein is exemplary and one skilled in the art might extend the teachings herein to division of output signals to other frequencies, or even employ multipliers to raise the frequencies of the output signals. Control signal CNTRL is modified to not only select a certain input signal of, but also to enable and disable the output signals of MUXs 1007(1) and 1007(2) so as to obtain the selected signal with the desired output signal oscillation frequency.

Figure 11:
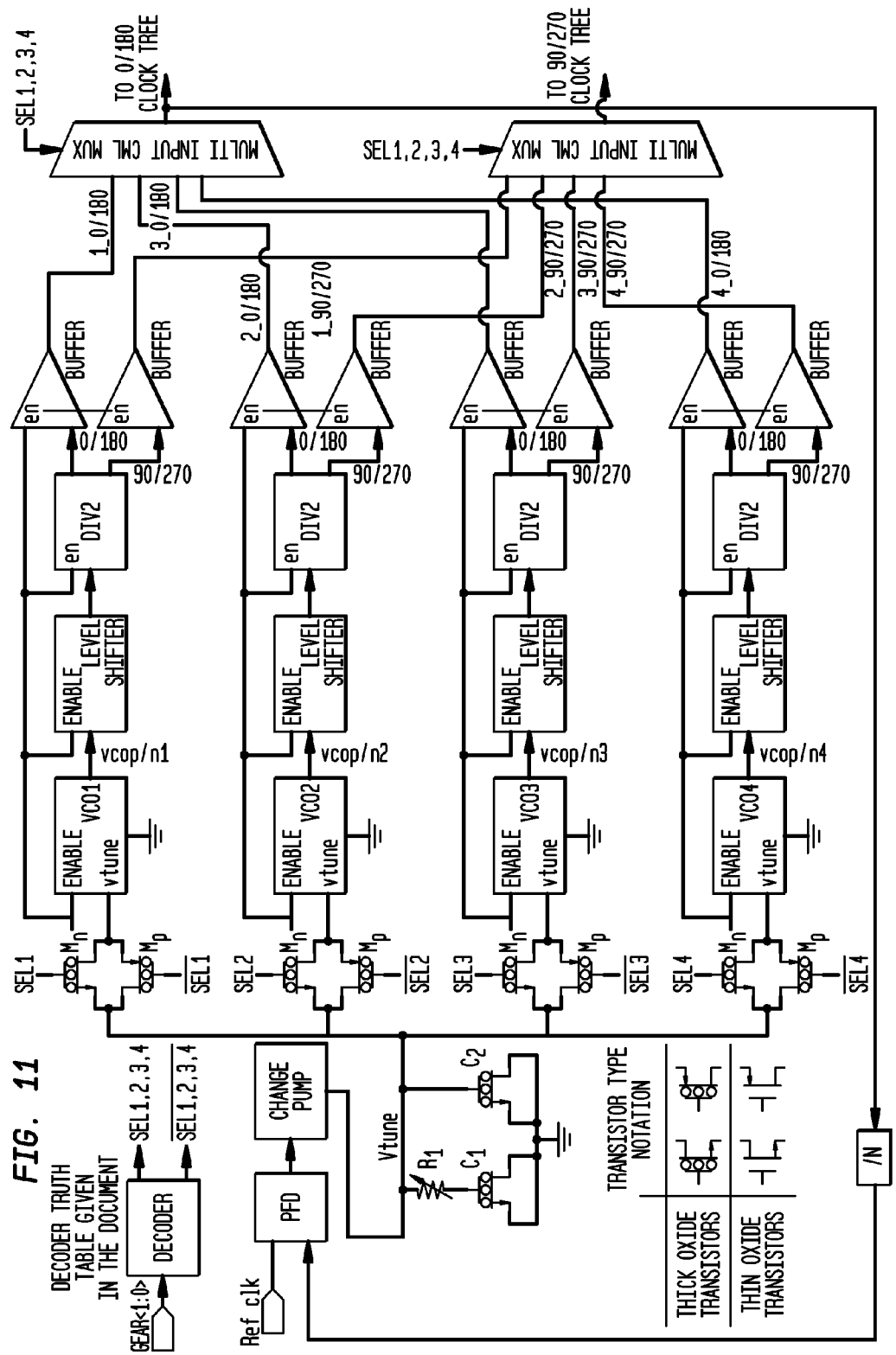
FIG. 11 shows an exemplary implementation for the Quad-VCO WTR LCPLL in accordance with the second aspect of the present invention.
Figure 12:
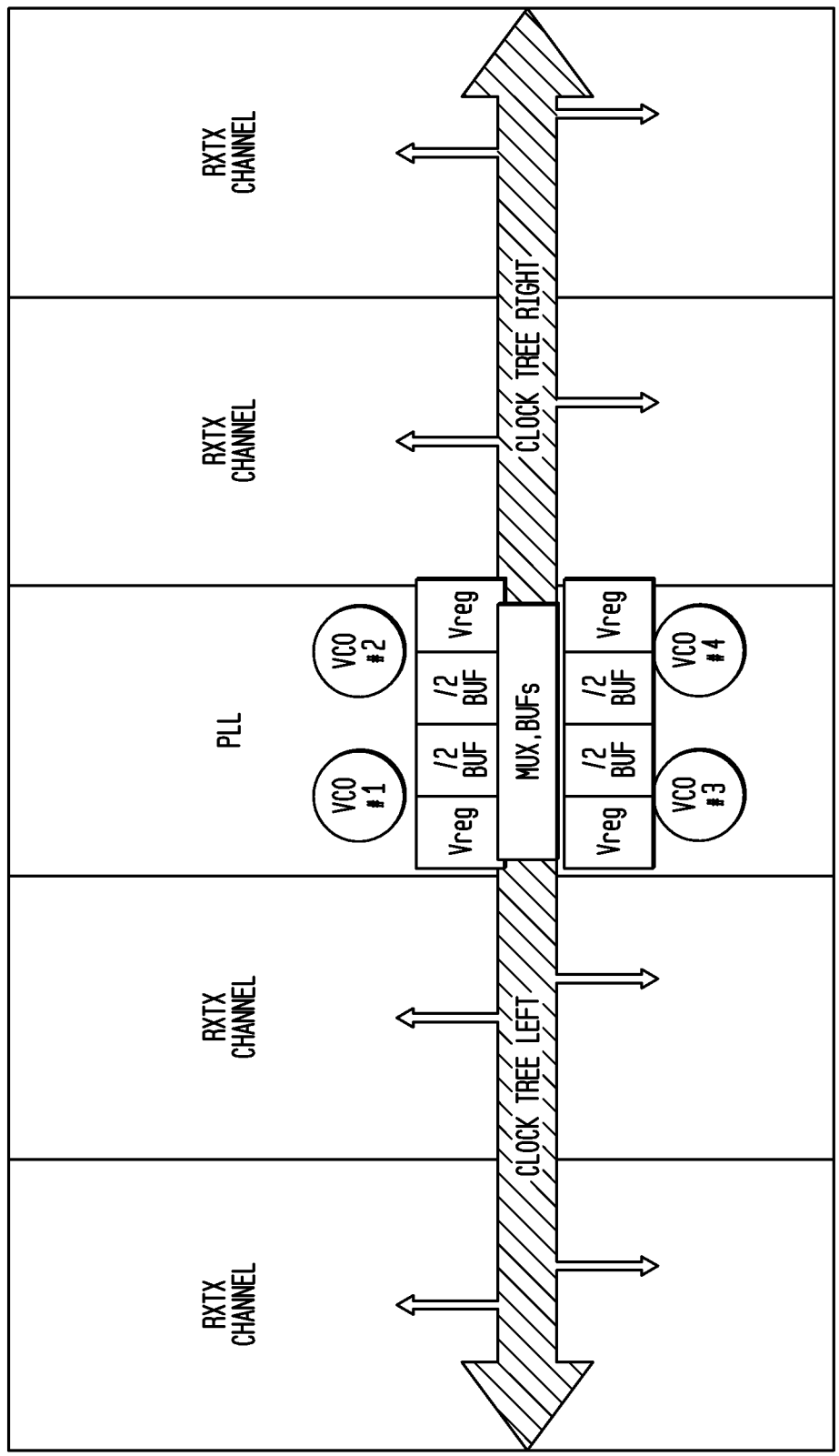
FIG. 12 shows compact SoC circuit subsystem implementation layout clock distribution plan over right and left clock trees for the exemplary implementation of FIG. 11.

Based on this second aspect of the present invention, the single, wide tuning-range LCVCO as shown in FIGS. 3 and 7 might be modified to provide the implementation as shown in FIG. 11. As shown in FIG. 11, a Quad-VCO circuit path implementation of the WTR LCPLL includes two MUXs (CML MUXs) and a divide-by-2 counter (DIV2) for each LCVCO path, with corresponding level shifters and buffers. The Quad-VCO circuit path implementation of the WTR LCPLL shown in FIG. 11 allows for a relatively compact SoC circuit subsystem implementation for a device providing many oscillation frequencies to circuits of the SoC through a clock tree. Such compact SoC circuit subsystem implementation layout, VCO location (which generally determines inductor location) and clock distribution plan over right and left clock trees is shown in FIG. 12. The MUXs and buffers are shown directly coupled to the clock tree, and VCOs #1-#4 are arranged on either side of the clock tree, with corresponding voltage regulators (Vreg), divide-by-2 counters (/2) and buffers (blip for each LCVCO path in between.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention. Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

It will be further understood that various changes in the details, materials, and arrangements of the parts which have been described and illustrated in order to explain the nature of this invention may be made by those skilled in the art without departing from the scope of the invention as expressed in the following claims.

We claim:

1. Apparatus for generating a signal with a phase locked loop (PLL) having a selected one of a plurality of oscillation frequencies, the apparatus comprising:
   a multiplexor (MUX) configured to select the signal having the selected one of the plurality of oscillation frequencies based on a control signal;
   a loop filter configured to provide a tuning voltage based on a feedback loop of the PLL, wherein the loop filter includes a loop filter capacitance; and
   at least two inductive-capacitive (LC) voltage controlled oscillator (VCO) paths, each LCVCO path coupled between the loop filter and the MUX and having its oscillation frequency set by the tuning voltage,
   wherein each LCVCO path comprises
      a LCVCO configured to provide an output signal at one of the plurality of oscillation frequencies, wherein the LCVCO; and
      a T-gate switch configured to i) couple the associated LCVCO to the tuning voltage when enabled by the control signal to set the LCVCO path to an active state, and ii) insert a relatively high impedance between the capacitance of the loop filter and a capacitance of the associated LCVCO when disabled by the control signal to set the LCVCO path into a dormant state, thereby setting the leakage current of the associated LCVCO to a relative minimal value and maintaining the capacitance value of the loop filter, and
   wherein the MUX provides an output of the LCVCO path in the active state to provide the signal having the selected one of the plurality of oscillation frequencies.

2. The apparatus of claim 1, wherein the feedback loop of the PLL comprises:
   a phase frequency detector (PFD) configured to generate a difference between a reference signal and an output signal of the PLL from the MUX; and
   a charge pump configured to increase or decrease output charge of the charge pump based on the difference,
   wherein the loop filter provides the tuning voltage based on the output charge.

3. The apparatus of claim 1, wherein, for each disabled associated LCVCO, the corresponding T-gate switch isolates a fixed capacitance of the loop filter from the capacitance of the associated LCVCO.

4. The apparatus of claim 1, further comprising a controller, the controller configured to generate the control signal, wherein:
   the control signal selectively enables the T-gate switch and a power supply of the LCVCO corresponding to the LCVCO path having a selected frequency of operation, and concurrently disables the T-gate switch and a power supply of each LCVCO corresponding to each non-selected LCVCO path, thereby placing each non-selected LCVCO path in a dormant state.

5. The apparatus of claim 1, wherein each LCVCO includes an inductance and the associated capacitance, the LCVCO capacitance formed by capacitance of a back-toback varactor pair and a switched capacitor bank, wherein an oscillation frequency of the LCVCO is set by the values of the inductance and the associated capacitance.

6. The apparatus of claim 1, wherein each LCVCO further comprises at least one of:
   a level shifter, wherein the level shifter is configured to adjust the output level of the LCVCO signal by a predefined level value;
   a counter, wherein the counter is configured to divide the oscillation rate of the LCVCO signal by a predefined oscillation value; and
   a buffer, wherein the buffer is configured to enhance driving strength to the subsequent circuit stages.

7. The apparatus of claim 6, wherein the MUX comprises at least two MUX circuits, each MUX circuit having an associated frequency range of operation, and wherein an output of each LCVCO and an output of each counter is provided to a corresponding one of the at least two MUX circuits based on the output oscillation frequency and the associated frequency range of operation of the corresponding MUX circuit.

8. The apparatus of claim 1, further comprising a counter coupled between the MUX and a phase frequency detector (PFD), the PFD configured to generate a difference between a reference signal and an output signal of the PLL from the MUX, and the counter configured to scale the output signal of the PLL by N, wherein N is a positive number.

9. The apparatus of claim 1, wherein the apparatus is embodied in a serializer-deserializer (SERDES) device.

10. A method of generating a signal with a phase locked loop (PLL) having a selected one of a plurality of oscillation frequencies, the method comprising:
   enabling, with a control signal, a multiplexor (MUX) and at least one of two or more inductive-capacitive (LC) voltage controlled oscillator (VCO) paths;
   providing, with a loop filter, a tuning voltage based on a feedback loop of the PLL to the two or more LCVCO paths between the loop filter and the MUX; and
   setting an oscillation frequency of an associated LCVCO of each enabled LCVCO path by the tuning voltage; and
   providing, by the MUX, an output of the enabled LCVCO path as the signal having the selected one of the plurality of oscillation frequencies,
   wherein enabling with the control signal further comprises
      coupling, with a T-gate switch, the associated LCVCO of the LCVCO path to the tuning voltage when enabled by the control signal, thereby setting the enabled LCVCO path to an active state,
      inserting a relatively high impedance between a capacitance of the loop filter and a capacitance of the associated LCVCO when disabled by the control signal, thereby i) setting the LCVCO path to a dormant state, ii) setting the leakage current of the associated LCVCO to a relative minimal value and iii) maintaining the capacitance value of the loop filter.

11. The method of claim 10, wherein, for the feedback loop of the PLL, the method comprises:
   generating, with a phase frequency detector (PFD), a difference between a reference signal and an output signal of the PLL from the MUX; and
   adjusting, with a charge pump, output charge of the charge pump based on the difference, and
   providing, with the loop filter, the tuning voltage based on the output charge.

12. The method of claim 10, wherein each associated LCVCO path in the dormant state, the inserting a relatively high impedance comprises isolating, with the corresponding T-gate switch, a fixed capacitance of the loop filter from a capacitance of the LCVCO of the associated LCVCO path.

13. The method of claim 10, further comprising
   generating, with a controller, the control signal, and
   selectively enabling, with the control signal, the T-gate switch and a power supply of the LCVCO corresponding to the LCVCO path having a selected frequency of operation, and
   concurrently disabling the T-gate switch and a power supply of each LCVCO corresponding to each non-selected LCVCO path, thereby placing each non-selected LCVCO path in a dormant state.

14. The method of claim 10, wherein each LCVCO includes an inductance and the associated capacitance, the LCVCO capacitance formed by capacitance of a back-to-back varactor pair and a switched capacitor bank, wherein setting an oscillation frequency of the LCVCO includes setting the values of the inductance and the associated capacitance.

15. The method of claim 10, wherein each LCVCO further comprises at least one of a level shifter, a counter, and a buffer, the method further comprising:
   adjusting, with the level shifter, the output level of the LCVCO output signal by a predefined level value;
   dividing, with the counter, the oscillation rate of the LCVCO signal by a predefined oscillation value; and
   enhancing, with the buffer, driving strength to the subsequent circuit stages.

16. The method of claim 15, wherein the MUX comprises at least two MUX circuits, each MUX circuit having an associated frequency range of operation, and wherein an output of each LCVCO and an output of each counter is provided to a corresponding one of the at least two MUX circuits based on the output oscillation frequency and the associated frequency range of operation of the corresponding MUX circuit.

17. The method of claim 10, wherein the PLL comprises a counter coupled between the MUX and a phase frequency detector (PFD), the method comprising:
   generating, with the PFD, a difference between a reference signal and an output signal of the PLL from the MUX, and
   scaling, with the counter, the output signal of the PLL by N, wherein N is a positive number.

18. The method of claim 10, wherein the method is embodied as steps of a processor in a serializer-deserializer (SERDES) device.

19. A non-transitory, machine-readable storage medium, having encoded thereon program code, wherein, when the program code is executed by a machine, the machine implements a method for generating a signal with a phase locked loop (PLL) having a selected one of a plurality of oscillation frequencies, comprising the steps of:
   enabling, with a control signal, a multiplexor (MUX) and at least one of two or more inductive-capacitive (LC) voltage controlled oscillator (VCO) paths;
   providing, with a loop filter, a tuning voltage based on a feedback loop of the PLL to the two or more LCVCO paths between the loop filter and the MUX; and
   setting an oscillation frequency of an associated LCVCO of each enabled LCVCO path by the tuning voltage; and
   providing, by the MUX, an output of the enabled LCVCO path as the signal having the selected one of the plurality of oscillation frequencies,
   wherein enabling with the control signal further comprises
      coupling, with a T-gate switch, the associated LCVCO of the LCVCO path to the tuning voltage when enabled by the control signal, thereby setting the enabled LCVCO path to an active state, inserting a relatively high impedance between a capacitance of the loop filter and a capacitance of the associated LCVCO when disabled by the control signal, thereby i) setting the LCVCO path to a dormant state, ii) setting the leakage current of the associated LCVCO to a relative minimal value and iii) maintaining the capacitance value of the loop filter.

20. The non-transitory, machine-readable storage medium of claim 19, wherein each associated LCVCO path in the dormant state, the inserting a relatively high impedance comprises isolating, with the corresponding T-gate switch, a fixed capacitance of the loop filter from a capacitance of the LCVCO of the associated LCVCO path.

* * * * *